(12) United States Patent
Hower et al.

(10) Patent No.: US 7,417,270 B2
(45) Date of Patent: Aug. 26, 2008

(54) DISTRIBUTED HIGH VOLTAGE JFET

(75) Inventors: Philip L. Hower, Concord, MA (US);
David A. Walch, Bedford, NH (US);
John Lin, Chelmsford, MA (US);
Steven L. Merchant, Bedford, NH (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/874,479

(22) Filed: Jun. 23, 2004

(65) Prior Publication Data

US 2005/0285157 A1 Dec. 29, 2005

(51) Int. Cl.
*H01L 29/80* (2006.01)

(52) U.S. Cl. .................. 257/270; 257/269; 257/285; 257/286; 257/E27.012

(58) Field of Classification Search .......... 257/134, 257/256, 269–270, 285–287, 217, 404, 194, 257/E27.012
See application file for complete search history.

(56) References Cited

U.S. PATENT DOCUMENTS

| | | | |
|---|---|---|---|
| 4,700,461 A | 10/1987 | Dougherty | |
| 4,959,697 A * | 9/1990 | Shier et al. | 257/279 |
| 5,198,879 A * | 3/1993 | Ohshima | 257/20 |
| 6,020,607 A | 2/2000 | Nagai | |
| 6,097,046 A | 8/2000 | Plumton | |
| 6,111,423 A | 8/2000 | Imoto | |
| 6,125,046 A | 9/2000 | Jang et al. | |
| 6,271,550 B1 | 8/2001 | Gehrmann | |
| 6,542,001 B1 * | 4/2003 | Yu | 326/68 |
| 2002/0008260 A1 * | 1/2002 | Yamazaki et al. | 257/288 |
| 2003/0117825 A1 | 6/2003 | Liaw et al. | |
| 2004/0222475 A1 * | 11/2004 | Hao et al. | 257/376 |

* cited by examiner

*Primary Examiner*—Howard Weiss
*Assistant Examiner*—John C Ingham
(74) *Attorney, Agent, or Firm*—Frederick J. Telecky, Jr.; Wade J. Brady, III (57) ABSTRACT

A Junction Field Effect Transistor (JFET) can be fabricated with a well region that include a channel region having an average dopant concentration substantially less the average doping concentration of the remaining portions of the well region. The lower average doping concentration of channel region compared to the remaining portions of the well region reduces the pinch-off voltage of the JFET.

26 Claims, 6 Drawing Sheets

DISTRIBUTED HIGH VOLTAGE JFET

TECHNICAL FIELD

The present invention relates generally to semiconductor integrated circuits and, more particularly, to Junction Field Effect Transistor structures and their fabrication.

BACKGROUND OF THE INVENTION

There are two basic types of transistors, namely Field Effect Transistors (FETs) and bipolar transistors. In general, current is conducted in FETs by charge carriers (e.g., electrons and holes) typically flowing through one type of semiconductor material, either n-type or p-type materials. In bipolar transistors, current passes in series through both n-type and p-type semiconductor materials.

Within the category of FETS, there are two basic types, namely the Metal Oxide Semiconductor (MOS) FET and the Junction FET (JFET). A primary difference between these two types of transistors is that the gate of the MOSFET has a layer of insulating material, typically referred to as gate oxide, between the gate and the other transistor electrodes. Consequently, channel current in a MOSFET is controlled by the application of electric fields across the channel to enhance and deplete the channel region, as operation requires. The gate of the JFET forms a PN junction with the other electrodes of the transistor, which can be reverse biased by the application of a predetermined gate voltage. Thus, the gate PN junction can be utilized to control the channel current by varying the extent of a depletion region to selectively dimension the current-carrying channel.

Figure 1:
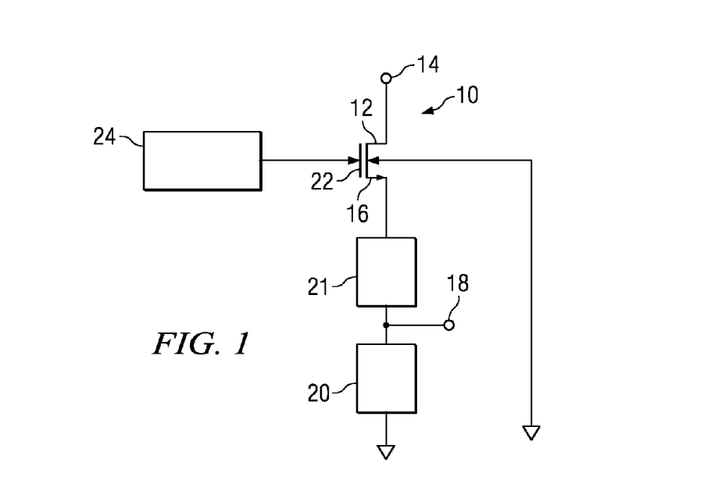
FIG. 1 is a schematic illustration of a prior art JFET start-up circuit.

JFETs are often employed in start-up circuits (e.g., for telecom and datacom equipment in central offices, PBXs, and servers) where a small current (mA) is supplied from a high (e.g., about 100 V) DC. One example of a schematic for a 110V start-up JFET for a telecom device is shown in FIG. 1. The JFET 10 includes a drain 12, a source 16, and a gate 22. The drain 12 is coupled to an input voltage (Vin) 14, the source 16 coupled to a supply voltage (Vdd) 18 and a bypass capacitor 20 via a voltage drop component 21, and the gate 22 is coupled to a gate control 24.

At the beginning of start-up, the gate control 24 provides a low-impedance path between gate 22 and source 16, giving Vgs near zero. This means that the JFET 10 is on and current will flow into the capacitor 20 and also to any load connected to the source terminal 18. In a typical start-up circuit, the load current is small and most of the current flows into the capacitor 20. The capacitor charges, increasing Vdd, which eventually reaches a desired operating value $Vdd_{Op}$. At this point, the low-impedance path between gate and source is opened and a second low-impedance path is turned on between gate 22 and ground. These connections have the effect of reverse biasing the gate-source by $Vdd_{Op}$ volts. If $Vdd_{Op}$ is greater than the JFET pinch-off voltage, Vp, the JFET will be turned off. If Vp exceeds $Vdd_{Op}$, then additional voltage dropping components need to be added in series with the source to increase the magnitude of Vgs, for example diodes or a pnp bipolar transistor.

SUMMARY OF THE INVENTION

The present invention generally relates to a JFET device that is capable of use for high voltage applications. The JFET can include a semiconductor layer, such as an epitaxial layer with a first conductivity type, and a well region with a second conductivity that is arranged within the semiconductor layer. The well region includes a channel region of the second conductivity type, which controls the current between source and drain regions of the JFET. The channel region of the well region has a substantially reduced average dopant concentration compared to the average dopant concentration of the well region. The substantially reduced average dopant concentration of the channel region of the JFET provides the JFET with a lower pinch-off voltage compared to a JFET where the average dopant concentration is essentially the same in channel region as the well region. By having a lower pinch-off voltage, the JFET, when used, for example, in a start-up circuit for a telecom device, can be more readily turned-off and, thereby, save substantial power compared to a conventional JFET used in a start-up circuit. In addition, the start-up circuit design is less complex than for a conventional JFET.

In one aspect of the invention, the channel region can include a plurality of implant regions at least partially separated from one another by a plurality of diffusion regions. The plurality of implant regions and diffusion regions can be formed by providing a mask over the semiconductor layer during formation of the well region that blocks implantation of the dopant into at least some areas the semiconductor layer in which the channel region is to be formed. After implantation of the well region, the well region can be heated (e.g., annealed) at a temperature effective to drive-in or diffuse at least some dopant from the implanted areas to the non-implanted areas. This provides a continuous n-type doped channel region that comprises the implanted regions, which correspond to the implanted area, and the diffusion regions, which correspond to non-implanted areas.

In another aspect of the invention, the gate region of the JFET can be segmented into separate portions. The separate portions of the gate region can be coincident with the implant regions so that a separate portion of the gate region is provided within each implant region and does not substantially extend within the diffusion regions. Forming the gate region only within the implanted regions and not within the diffusion regions mitigates undesirable leakage current in the JFET.

BRIEF DESCRIPTION OF THE DRAWINGS

The foregoing and other aspects of the present invention will become apparent to those skilled in the art to which the present invention relates upon reading the following description with reference to the accompanying drawings.

DETAILED DESCRIPTION OF THE INVENTION

The present invention relates generally to junction field effect transistors (JFETs) and to fabrication methods for JFETs. The JFET can include a semiconductor layer, such as an epitaxial layer with a first conductivity type, and a well region with a second conductivity. The well region includes a channel region of the second conductivity type, which controls the current between source and drain regions of the JFET. The channel region includes a plurality of implant regions at least partially separated from one another by a plurality of diffusion regions. The channel region of the well region has a substantially reduced average dopant concentration compared to the average dopant concentration of the well region. The substantially reduced average dopant concentration of the channel region of the JFET provides the JFET with a lower pinch-off voltage compared to a JFET where the average dopant concentration is essentially the same in channel region as the well region. By having a lower pinch-off voltage, the JFET, when used, for example, in a start-up circuit for a telecom device, can be more readily turned-off and, thereby, save substantial power compared to a conventional JFET used in a start-up circuit.

Figure 2:
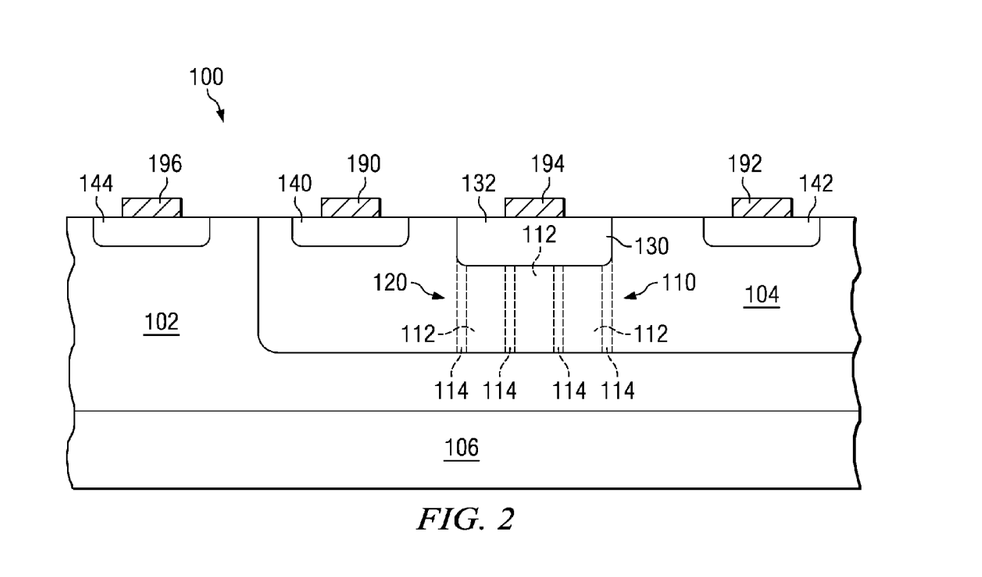
FIG. 2 is a schematic cross-sectional illustration of a JFET in accordance with an aspect of the present invention.

FIG. 2 illustrates an example of a JFET 100 in accordance with an aspect of the invention. For purposes of simplicity of illustration and explanation, the JFET 100 will be described as an n-type JFET (n-JFET) although those skilled in the art will understand and appreciate that p-type JFETs (p-JFETs) can also be fabricated in accordance with an aspect of the present invention.

The JFET 100 in accordance with the present invention includes a p-semiconductor layer 102 having embedded therein an n-well 104. The p-semiconductor layer 102 can be a p-epitaxial layer that is grown or deposited over a p+type semiconductor substrate 106 to have a thickness that affords use of the JFET 100 in high voltage applications. The p-semiconductor layer 102 can be formed of a suitable p-type material according to the type of substrate 106 being used. The p-semiconductor layer 102 can have, for example, a thickness greater than about 3 μm, (e.g. about 6 to about 7 μm). The p+type substrate can comprise a semiconductor wafer of, for example, silicon or gallium arsenide, doped with a p+type dopant, such as boron (B). The n-well region 104 can be formed in the p-semiconductor layer 102 by implanting a desired concentration of n-type dopant (e.g., phosphorous (P)) in the p-semiconductor layer.

The n-well 104 includes a dilution region 110 that has the same conductivity type (i.e., implanted with the same dopant type) as the n-well. The dilution region 110 includes a plurality of implant regions 112 and a plurality of diffusion regions 114 that at least partially separate the implant regions 112 from one another. The implant regions 112 and the diffusion regions 114 can be arranged transversely to the direction of current flow through the JFET and can extend in a vertical direction through the n-well 104 to the p-semiconductor layer 102.

The implant regions 112 and the diffusion regions 114 can be formed during the formation of the n-well 104 by modifying an n-well mask (not shown) to have blocking areas. The blocking areas block implantation of the n-type dopant into at least some areas the p-semiconductor layer in which the dilution region 110 is formed to create a plurality of implanted areas that are at least partially separated from one another by a plurality of non-implanted areas. After implantation of the p-semiconductor layer 102 to form the n-well, the n-well 104 can be heated (e.g., annealed) at a temperature effective to drive-in or diffuse at least some n-type dopant from the implanted areas to the non-implanted areas. This provides the dilution region 110 with a continuous n-type doped channel region 120 that comprises the implanted regions 112, which correspond to the implanted areas, and the diffusion regions 114, which correspond to non-implanted areas.

The dilution region 110 and, hence, the channel region 120, so formed, has a substantially lower average dopant concentration than the other portions of the n-well 104 as well as the n-well 104 as a whole. The average dopant concentration of the dilution region 110 is dependent on the ratio of the area of the implant regions 112 to the area of the diffusion regions 114. The smaller the ratio of the area of the implant regions 112 to the area of the diffusion regions 114, the lower the average dopant concentration of the dilution region 110 compared to the n-well 104. The greater ratio of the area of the of the implant regions 112 to the area of the diffusion regions 114 the more similar the average dopant concentration of the dilution region 110 will be to the average dopant concentration of the n-well 104.

The average dopant concentration of the dilution region 110 determines the pinch-off voltage of the JFET 100 and the current flow through the channel region 120. The lower the average dopant concentration of the dilution region 110 of the JFET 100, the lower the JFET's pinch-off voltage. Conversely, the higher average dopant concentration of the dilution region 110 of the JFET 100, the higher the JFET's pinch-off voltage.

By providing dilution region 110 of the JFET 100 with a lower average dopant concentration compared to conventional JFETs, which have essentially the same average doping concentration across the n-well, the JFET 100 in accordance with the present invention can have a substantially reduced pinch-off voltage compared to conventional JFETs. The substantially reduced pinch-off voltage for the JFET 100 in accordance with the present invention can be less than the supply voltage Vdd, which eliminates the need to add components in series with the JFET 100 to reach the pinch-off voltage. This substantially reduced pinch-off voltage can also be adjusted by controlling the area of implanted regions 112 to diffusion regions 114 of the dilution region 110.

A gate region 130 (or base region) extends through a surface 132 of the dilution region 110 and defines the area of the channel region 120, which extends below the gate region 130 through the dilution region 110. The gate region 130 can be formed by implanting a desired concentration of a p+type dopant (e.g., B, $B_{11}$, and $BF_2$) through a patterned mask.

A source region 140 and a drain region 142 are provided in laterally spaced arrangement on either side of the gate region 130 in the n-well 104 so that the gate region 130 is interposed between the source region 140 and the drain region 142. The source region 140 and the drain region 142 have a n+type conductivity and can be formed in the n-well 104 by implanting a desired concentration of a n+type dopant (e.g., P, arsenic (As), and/or antimony (SB)) through a patterned mask, such as a source/drain implant mask.

A back gate region 144 is also provided in the p–semiconductor 102 layer laterally displaced from the n-well 102 in which is arranged the source region 140, drain region 142, and gate region 130. The back gate region 144 like the gate region 130 has a p+type conductivity and can be formed by implanting desired concentration of a p+type dopant (e.g., B, $B_{11}$, and/or $BF_2$) through a patterned mask.

Figure 3:
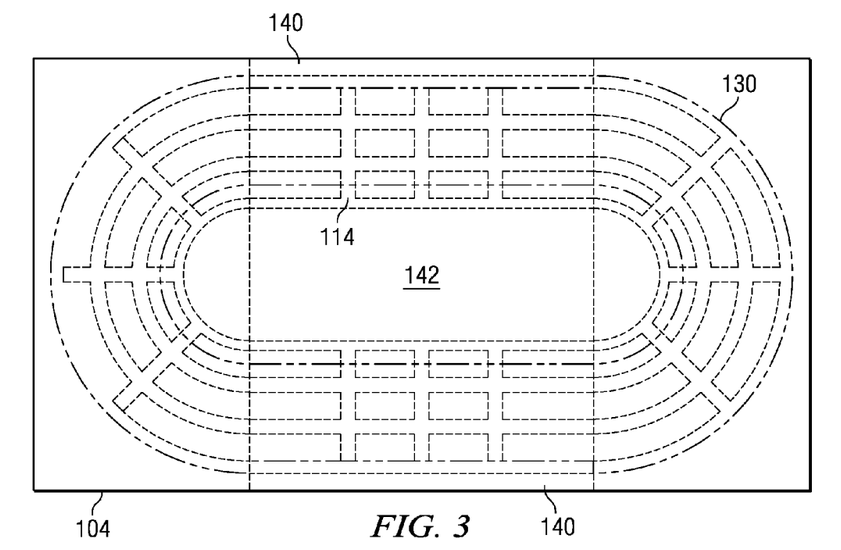
FIG. 3 is a schematic top-plan view of the JFET of FIG. 2 in accordance with an aspect of the present invention.

Referring to FIG. 3, which is a top-plan of a portion of FIG. 2 in accordance with an aspect of the invention, the gate region 130 can be arranged about the drain region in the n-well in a substantially annular configuration (e.g., substantially oval or "race track" configuration). The source region 140 in this aspect of the invention is provided in the n-well 104 laterally displaced from the drain region 142 outside and along the sides of the annular gate region 130. Providing the gate region with a substantially annular configuration that surrounds the drain region 142 mitigates the current leakage that can potentially occur from the drain region 142. It will be appreciated that although gate is illustrated as having a substantially elliptical configuration it can have other annular configurations, such as circular, elliptical, and rectangular as well as other configurations that do not surround the drain region 142.

Figure 4:
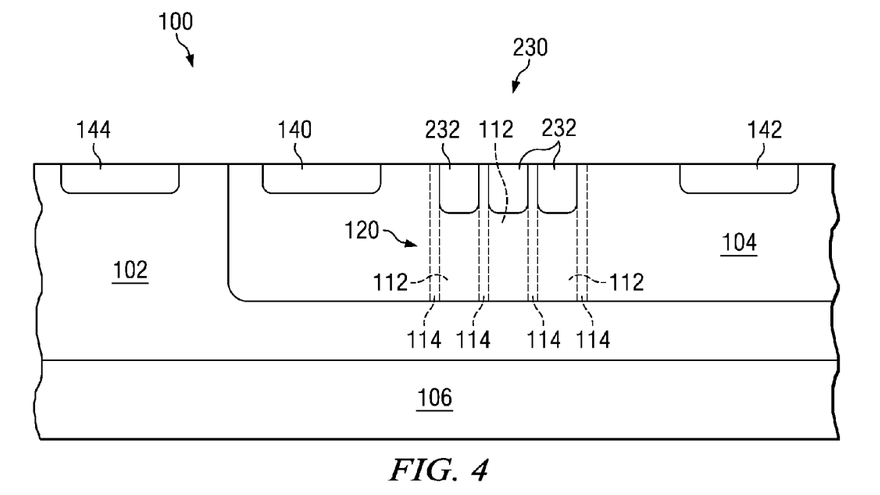
FIG. 4 is a schematic cross-sectional view of a JFET in accordance with another aspect of the invention.

Optionally, as shown in FIG. 4, the gate region 230 of the JFET 100 can be segmented into separate portions 232 within the dilution region 110. The separate portions 232 of the gate region 230 are coincident with the implanted regions 112 of the dilution region 110 so that a separate portion of the gate region 230 is provided within each implant region 112 and does not substantially extend within the diffusion regions 114 of the dilution region 110. It was found that for source follower circuit applications of the JFET 100, the doping in the dilution region 110 can be so light the channel region 120 can potentially be shorted (i.e., punched through) by undesirable leakage current between gate region 130 and p–semiconductor layer 102. The punch through, however, was found to be mitigated by forming the gate region 230 only within the implanted regions 112 and not within the diffusion regions 114. The segmented gate 230 can be formed by implanting a desired concentration of a p+type dopant (e.g., B, $B_{11}$, and/or $BF_2$) through a patterned mask, which has blocking areas that are substantially coincident with the blocking areas of the mask used to form the implanted region 112 of the dilution region 110.

Figure 5:
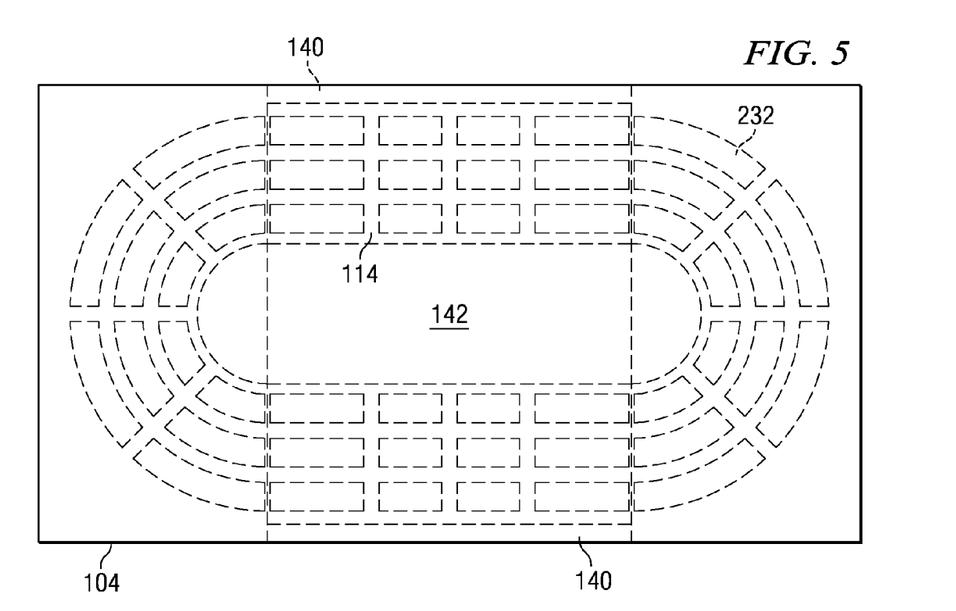
FIG. 5 is a schematic top-plan view of the JFET of FIG. 3 in accordance with an aspect of the present invention.

FIG. 5 shows that the segmented gate region 230 of FIG. 4, like the gate region 130 of FIG. 3, can be arranged about the drain region 142 in the n-well 104 in a substantially annular configuration (e.g., substantially oval configuration). The source region 140 in this aspect of the invention is provided in the n-well 104 laterally displaced from the drain region 142 outside and along the sides of the annular gate region 130. Providing the gate region 130 with a substantially annular configuration that surrounds the drain region 142 further mitigates the current leakage that can potentially occur from the drain region 142. It will be appreciated that although gate region 232 is illustrated as having a substantially elliptical configuration it can have other annular configurations, such as circular and rectangular, as well as other configurations that do no surround the drain region 142.

Referring again to FIG. 2, the JFET can further include contacts 190, 192, 194, 196 that are provided (e.g., by metallization), respectively, on the source region 140, drain region 142, gate region 130, and back gate region 144 to electrically couple the JFET 100, for example, with a start-up circuit. Particularly the contacts 194 and 196 for the gate region 130 and the back gate region 144 can be electrically coupled together to provide a three terminal device.

It will be appreciated by those skilled in the art that the JFET 100 can include other implants, such as a threshold voltage implant, and/or a field oxide layer (not shown) to define separate moat regions for each of the gate region 130, the source region 140, and drain region 142 and provide improved performance and critical dimension control relative to conventional JFET structures. For example, the JFET can be disposed under a field oxide layer, such that it is better protected. Such protection mitigates hysteresis effects (e.g., walking) in the breakdown voltage characteristics of the JFET at the respective PN junctions, such as can occur due to charge build up near the JFET surface during PN junction breakdown. Moreover, it will be appreciated that the entire JFET can be fabricated efficiently as part of a CMOS process or Bi-CMOS process without any additional process steps, generally requiring only mask modifications.

Figure 6:
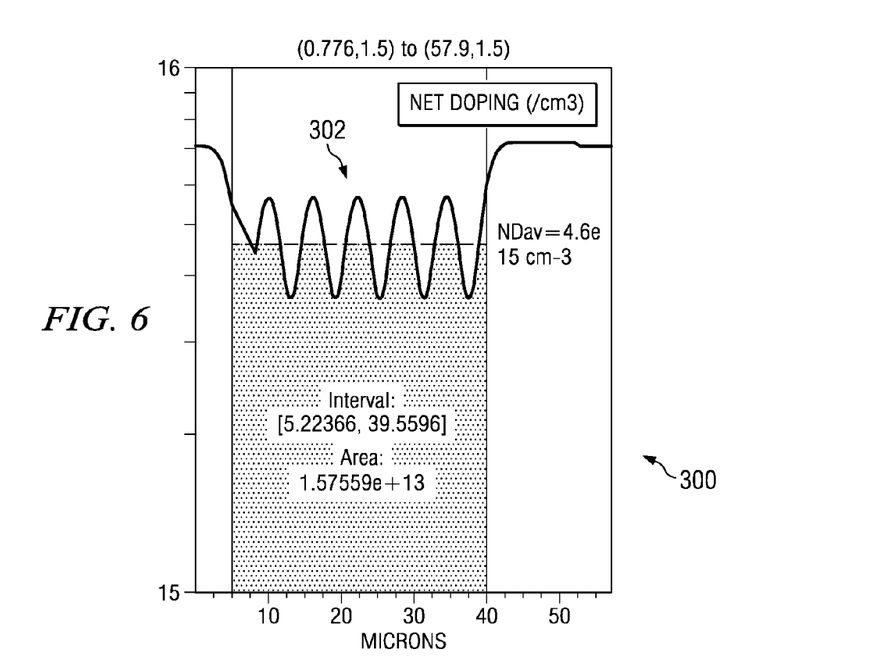
FIG. 6 is a graph depicting the doping concentration of a channel region of a JFET in accordance with an aspect of the invention.

FIG. 6 is a graph 300 depicting the doping concentration across the channel region of a JFET in accordance with an aspect of the invention. In this example, it can be seen that the channel region includes alternating areas 302 that have a higher and lower dopant concentration. These higher and lower average dopant concentration areas correspond to areas of the channel region in which the dopant during implantation was not blocked (i.e., implant region) and blocked (i.e., diffusion regions). The average dopant concentration for the channel region is about $4.6 \times 10^{15}$ cm$^{-3}$, which is substantially less than the average dopant concentration of the channel region (i.e., about $7.0 \times 10^{15}$ cm$^3$), if the dopant during implantation was not blocked to some areas of the channel region.

FIGS. 7 through 11 illustrate various parts of a process that can be utilized to fabricate a JFET in accordance with an aspect of the present invention. Those skilled in the art will understand and appreciate that many or all portions of the process can be implemented concurrently with a CMOS or Bi-CMOS. For example, fabricating a JFET can employ the same implants and same masks (as modified or recreated to accommodate JFET structures) and intermediate process steps as those associated with a CMOS or a Bi-CMOS process.

While the following process steps will be described mainly with respect to forming a n–type JFET structure, those skilled in the art will understand and appreciate that an p–type JFET also could be fabricated in accordance with an aspect of the present invention.

Figure 7:
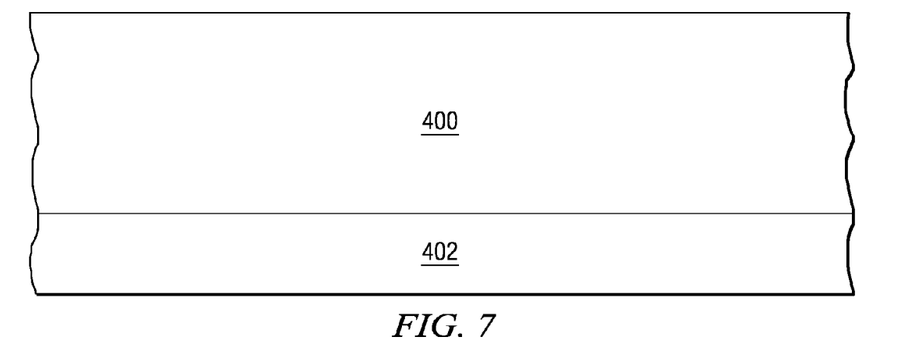
FIG. 7 is a schematic cross-sectional illustration of a semiconductor layer provided over a semiconductor substrate in accordance with an aspect of the invention.

Referring to FIG. 7, a p–type semiconductor layer 400 can be formed over a p+semiconductor substrate 402. The p+type semiconductor substrate 402 can comprise a wafer of a semiconductor material, such as silicon or polysilicon. Alternatively, the p+semiconductor substrate can be formed from material, such as gallium arsenide, germanium, silicon-germanium, indium phosphide, and other semiconductor substrate materials.

The p–semiconductor layer 400 can comprise a p–epitaxial layer that is grown over the p+semiconductor substrate 402. The p–type epitaxial layer 402, for example, can have a doping concentration of about $1 \times 10^{15}$ to about $1 \times 10^{16}$ atoms/cm$^3$ of a suitable dopant (e.g., B, $B_{11}$, $BF_2$). In accordance with an aspect of the present invention, the p–epitaxial layer 400 can be grown to have a thickness sufficient to enable the channel region of the resulting JFET to support high voltage applications, such as greater than about 20 V (e.g., about 30 V or higher). For example, the p–epitaxial layer 400 can have a thickness greater than about 3 µm (e.g., about 6 µm to about 7 µm ). The p–epitaxial layer 400 can have a resistivity of approximately 5.5 to 8.5 ohm-cm (e.g., about 7.0 ohm-cm). It will also be appreciated that the p–epitaxial layer can be formed with a thickness, for example, of about 20 µm to about 30 µm, but that diffusion of p+type dopant from the p+semiconductor substrate to the p–type epitaxial layer can result in the epitaxial layer having p–type region with a substantially reduced thickness (e.g., about 6 µm to about 7 µm).

Figure 8:
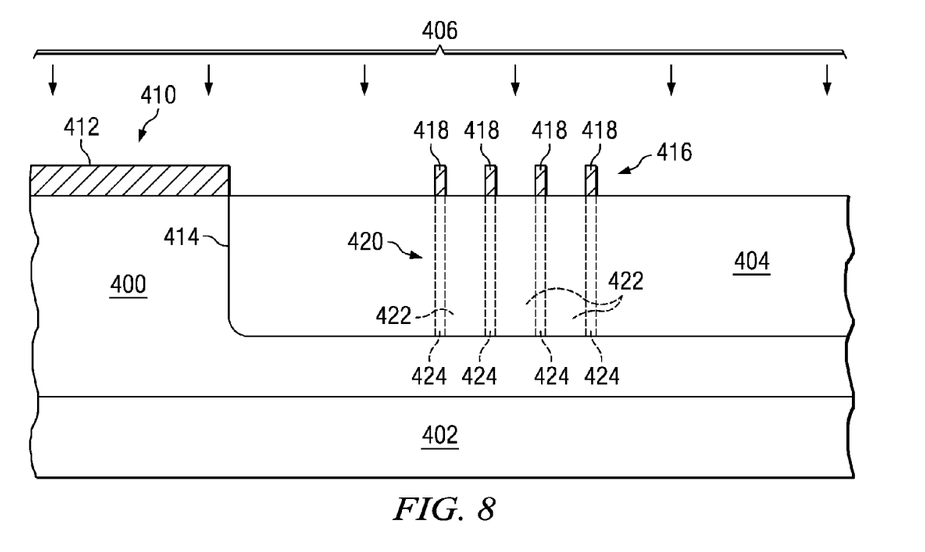
FIG. 8 is a schematic cross-sectional of a well region being formed in accordance with the present invention.

FIG. 8 illustrates an n-well 404 is formed in the p–semiconductor layer 400 by implanting an n–type dopant 406, such as phosphorous (P) and/or arsenic (As) in the p–semiconductor layer 400. During formation of the n-well 404 in the p–semiconductor layer 400, a mask 410 can be provided over the p–semiconductor layer 400. The mask 410 can be formed by providing a photoresist layer over the p–semiconductor layer 400 via conventional spin-coating or spin casting deposition techniques. The photoresist layer can developed, whereby photo-exposed regions are dissolved (e.g., etched) by a chemical, to provide the mask 410.

The mask 410 includes an outer portion 412 that defines an outer perimeter 414 of the n-well 404 in the p–semiconductor layer 400 and an inner portion 416 that comprises a plurality of blocking areas 418. The blocking areas 418 of the inner portion 416 of the mask 410 block implantation of the n–type dopant 406 into at least some areas the p–semiconductor layer 400 in which a dilution region 420 is formed. Blocking the implantation of an n–type dopant into at least some areas creates within the dilution region 420 a plurality of areas 422 that are implanted with the n–type dopant 406 (i.e., implanted areas) and a plurality of areas 424 that are not implanted with the n–type dopant 406 (i.e., non-implanted areas). The areas 424 that are not implanted with the n–type dopant 406 at least partially separate the areas 422 that are implanted with n–type dopant 406 within the dilution region 420.

By providing areas 422 within the dilution region 420 that are not implanted the n–type dopant 406, the average dopant concentration of the dilution region 420 is substantially reduced compared to the average dopant concentration of other portions of the n-well 404. For example, the portions of the n-well 404 outside the dilution region 420 can have an average dopant concentration of about $7 \times 10^{15}$ cm$^{-3}$ while the dilution region 420 can have an average dopant concentration of about $4.6 \times 10^{15}$ cm$^{-3}$. This lower average dopant concentration as discussed above provides the JFET once formed with a lower pinch-off voltage compared to JFET in which average dopant concentration is substantially the same across the n-well.

The area of the inner portion 416 of the mask 410 can be adjusted to control the average dopant concentration of the dilution region 420. As the area of inner portion 416 of the mask increases, more of the n–type dopant 406 is blocked, less area of the dilution region 420 is implanted with the n–type dopant 406, and the average dopant concentration of the dilution region 420 decreases. Conversely, as the area of inner portion 416 of the mask 410 decreases, less of the n–type dopant 406 is blocked, more area of the dilution region is implanted with the n–type dopant 406, and the average dopant concentration of the dilution region 420 increases. In one aspect of the invention, the inner portion 416 of the mask 418 covers less than about 25% of the dilution region 420 of the n-well 404 during the n–type dopant 406 implantation so that at least about 75% of the dilution region 420 is implanted with the n–type dopant 406.

The implantation of the n–type dopant 406 can be performed using, for example, an ion implanter that accelerates the dopant ions (e.g., P) at a high energy (e.g., about 75 to about 150 KeV). In an aspect of the invention, the n-well 404 can be formed with multiple implants. One example of an additional implant that can be used to form the n-well 404, is a well implant. A well implant is a high energy implant the forms a deep low resistance region in the n-well and helps prevent transient voltages from building up.

After ion implantation the mask 410 can be stripped off the p–semiconductor layer 400 and cleaned, for example, by a wet chemical cleanup. The wet chemical cleanup can include a surface cleaning process and/or a sulfuric acid-hydrogen peroxide-water solution (SPM) clean. Those skilled in the art will be familiar with a variety of cleanup procedures that can be used.

Figure 9:
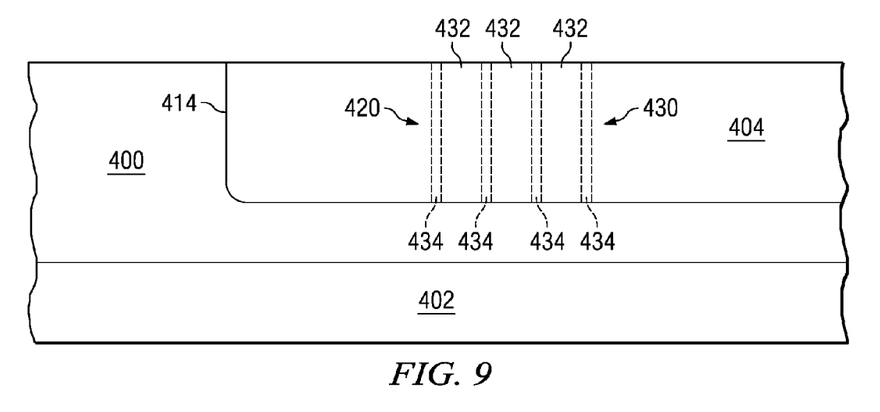
FIG. 9 is a schematic cross-sectional illustration after the well region has been heated to form a dilution region.

FIG. 9 illustrates that following implantation of the n–type dopant, the n-well 404 can be heated (i.e., annealed) at a temperature effective to drive-in or diffuse the n–type dopant from the implanted areas of the dilution region 420 to the non-implanted areas of dilution region. A temperature effective to drive-in the n–type dopants can be, for example, about 1000° C. to about 1200° C. It will be appreciated that other temperatures hotter or cooler that the about 1000° C. to about 1200° C. temperature can also be used depending on the type of material used to form the p–semiconductor layer and the dopant concentration.

Driving-in the n–type dopant to the non-implanted areas from the implanted areas provides the dilution region 420 with a continuous n–type doped channel region 430. This continuous n–type doped channel region has a plurality of implanted regions 432, which comprise the previous implanted areas, and a plurality of diffusion regions 434, which comprise the previous non-implanted areas. The diffusion regions 434 at least partially separate the implanted regions 432 from one another. The average dopant concentration of the dilution region 420 and hence the channel region 430 after drive-in remains essentially the same as the average dopant concentration of the dilution region 420 before drive-in, as the drive-in merely redistributes the n–type dopant in the non-implanted areas.

Figure 10A:
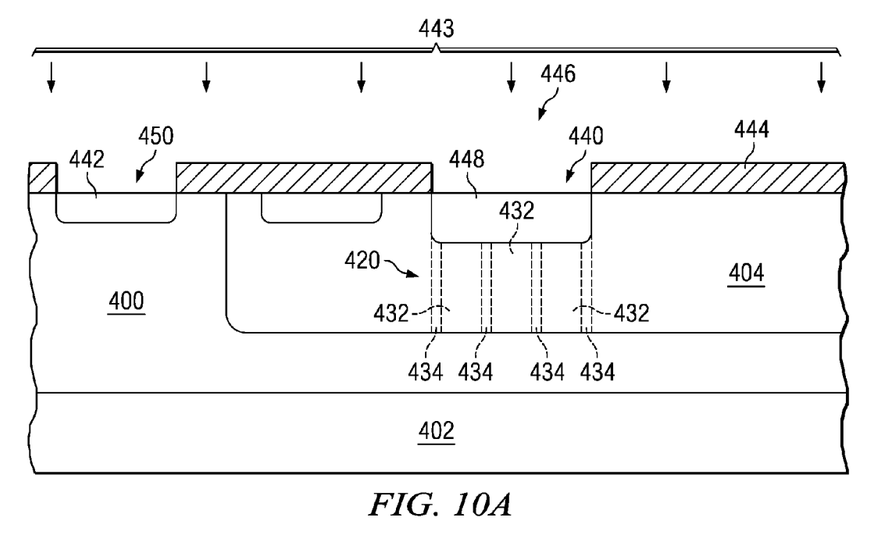
FIG. 10A is a schematic cross-sectional illustration of a gate region and back gate region being formed in accordance with the present invention.

FIG. 10A illustrates that following drive-in of the n–type dopant, a gate region 440 (or base region) and back gate region 442 are formed by implanting a p+type dopant 443, respectively, in the dilution region 420 and a portion of the p–semiconductor layer 400 adjacent the n-well 404. During formation of the gate region 440, a mask 444 is provided over the p–semiconductor layer 400 and n-well 404 that includes a first opening 446 that is substantially coincident with a surface 448 of the dilution region 440 and a second opening 450 that is coincident with the portion of p–semiconductor layer 400 in which the back gate 442 is formed. The implantation of the p+type dopant 443 can be performed using, for example, using an ion implanter that accelerates the dopant ions (e.g., B, $B_{11}$, and/or $BF_2$) at an effective energy and concentration to form the gate region 440 and back gate region 442. After ion implantation the mask layer can be stripped off the p–semiconductor layer 400 and cleaned, for example, by a wet chemical cleanup.

The gate region 440 so formed extends substantially across the dilution region 420 and defines the area of the channel region 430 below the gate region 440 in the n-well 404. The channel region 430 extends through the dilution region 420 and includes the plurality of implant regions 432 and the plurality of diffusion regions 434 that at least partially separate the implant regions 432. Accordingly, the channel region 430 has a substantially reduced average dopant concentration compared to the other portions of the n-well.

It will be appreciated that although the back gate 442 is described as being formed in the same implantation process used to form the gate region 440 overlying the dilution region 420, the back gate region 442 can be formed in separate process from the formation of the gate region 440.

Figure 10B:
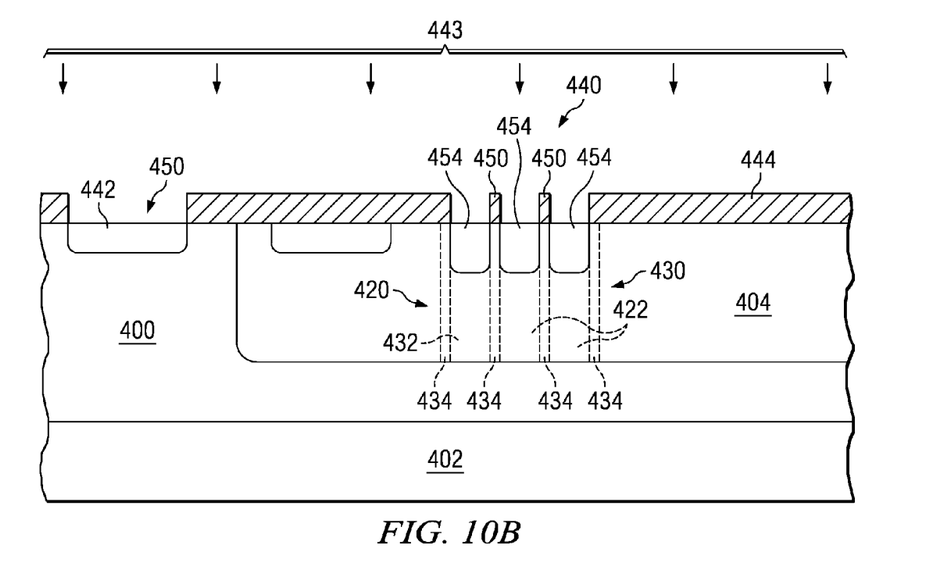
FIG. 10B is a schematic cross-sectional illustration of a segmented gate region and back gate region being formed in accordance with the present invention.

Optionally, as illustrated in FIG. 10B, the mask 444 used to form the gate region 440 can include a plurality of blocking areas 450 that block implantation of the p+type dopant into the diffusion regions 434 of the dilution region 420. The blocking areas 450 of the mask 444 used to form the gate region 440 can be substantially coincident with the blocking areas 418 (FIG. 8) of the mask 416 used to form the implanted regions 432 of the dilution region 420. Blocking the implantation of the p+type dopant into the diffusion areas 434 creates a segmented gate region 440 with separate gate portions 454 that extend only within the implanted regions 432 and not the diffusion regions 434 of the dilution region 420. This gate region 440 configuration substantially mitigates undesirable leakage current between the gate region 440 and the p–semiconductor layer 400.

After ion implantation the mask layer 444 can be stripped off the p–semiconductor layer and cleaned, for example, by a wet chemical cleanup. Those skilled in the art will be familiar with a variety of cleanup procedures that can be used.

Figure 11:
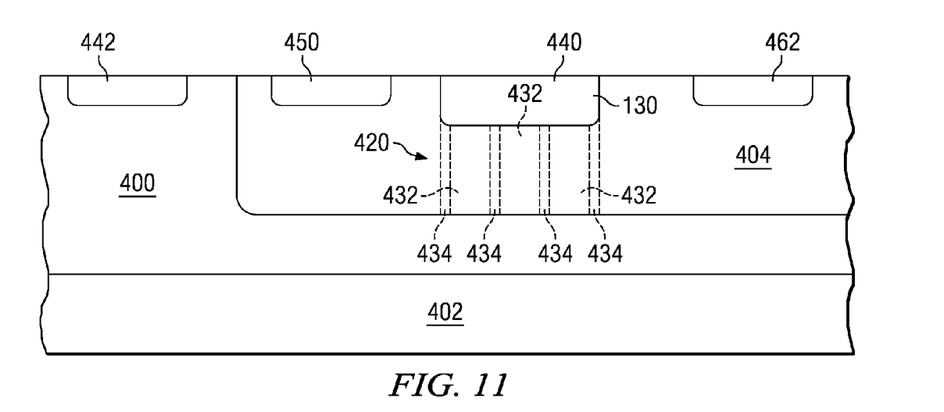
FIG. 11 is a schematic cross-sectional illustration of a source region and a drain region being formed in accordance with the present invention.

FIG. 11 illustrates that a source region 460 and a drain region 462 are formed, respectively, on either side of gate region 440 so that the gate region 440 is interposed between the source region 460 and the drain region 462 in the n-well 404. The source region 460 and the drain region 462 can be formed by implanting a n+dopant, such as P, As, and/or Sb, at a desired concentration through a patterned mask (not shown). Although the source region 460 and the drain region 462 are typically formed in the same implantation process, the source region 460 and the drain region 462 can be formed in separate processes.

Following formation of the gate region 440, back gate region 442, source region 460, and drain region 462, suitable contacts (not shown) can be formed on all of the active areas of the JFET device. Those skilled in the art will understand and appreciate various types of metal can be used to form the metal contacts including, for example, aluminum or copper metallization schemes.

Those skilled in the art will understand and appreciate that variations in the processing operations can be utilized in the formation of a JFET in accordance with an aspect of the present invention. For example, it is to be appreciated that the JFET can include additional implants, such as a voltage threshold implant, which can be used to improve the noise performance of the JFET. Moreover, it is to be appreciated that a field oxide layer can be formed at the surface of the JFET via patterning, etching, and furnace heating to define moat (or active) regions. The moat regions in the field oxide layer operate as a hard mask to facilitate moat formation during implantation of the dopants to form the respective gate, back gate, drain, and source regions. Those skilled in the art will also understand and appreciate that because the field oxide is provided to define separate moat regions for each of the gate, back gate, source, and drain regions, improved performance and critical dimension control can be potentially achieved relative to conventional JFET structures. For example, the n–type and p–type implants can be substantially self-aligned to the moat edges defined by the field oxide layer. Additionally, the n/p epitaxial junction if disposed under the field oxide layer can potentially be better protected. Such protection mitigates hysteresis effects (e.g., walking) in the break down voltage characteristics of the JFET at respective PN junctions, such as can occur due to charge build up near the JFET surface during PN junction breakdown.

What has been described above includes examples depicting how the present invention might be implemented. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A Junction Field Effect Transistor (JFET) comprising:
   a semiconductor layer of a first conductivity type;
   a well region of a second conductivity type formed in a substrate, the well region including a channel region having an average dopant concentration substantially less than the average doping concentration of the remaining laterally adjacent portions of the well region, and wherein the channel region comprises a plurality of alternating implant and diffusion regions of the second conductivity type, the plurality of separate implant regions being separated from one another by the plurality of separate diffusion regions, the implant regions having a higher average dopant concentration than the diffusion regions;
   a source region and a drain region of the second conductivity type arranged in a spaced apart relationship in the well region;
   a gate region of the first conductivity type interposed between the source region and the drain region and extending through the channel region of the well region, the gate region being segmented into a plurality of separate portions, the plurality of separate portions of the gate region being coincident with the plurality of separate implant regions and being within the plurality of separate implant regions.

2. The transistor of claim 1 the well region and the channel region being formed by ion implantation of a doping material.

3. The transistor of claim 1, the well region and the channel region being formed in the same ion implantation step.

4. The transistor of claim 1, the plurality of separate diffusion regions being formed by diffusion of the dopant between the plurality of separate implant regions.

5. The transistor of claim 1, wherein the area occupied by the plurality of separate implant regions comprises at least about 75% of the area of the channel region.

6. The transistor of claim 1, the first conductivity type being a p conductivity type and the second conductivity type being an n conductivity type.

7. The transistor of claim 1, the gate region having a substantially annular shape that surrounds the drain.

8. The transistor of claim 1, the semiconductor layer comprising a p–epitaxial layer that is formed over a p+type substrate.

9. A Junction Field Effect Transistor (JFET) comprising:
   a semiconductor layer of a first conductivity type;
   a well region of a second conductivity type formed in a substrate, the well region including a channel region having an average dopant concentration substantially less than the average doping concentration of the remaining portions of the well region;
   the channel region including a plurality of separate, alternating implant and diffusion regions of the second conductivity type, the plurality of separate implant regions being separated from one another by the plurality of diffusion regions, the implant regions having a higher average dopant concentration than the diffusion regions;
   a source region and a drain region of the second conductivity type arranged in a spaced apart relationship in the well region; and a gate region of the first conductivity type interposed between the source region and the drain region and extending through the channel region of the well region;

wherein the area occupied by the plurality of separate implant regions comprises at least about 75% of the area of the channel region.

10. The transistor of claim 9, the well region and the channel region being formed by ion implantation of a doping material.

11. The transistor of claim 9, the well region and the channel region being formed in the same ion implantation step.

12. The transistor of claim 9, the plurality of separate diffusion regions being formed by diffusion of the dopant between the plurality of separate implant regions.

13. The transistor of claim 9, the gate region being segmented into a plurality of separate portions, the plurality of separate portions of the gate region being coincident with the plurality of separate implant regions.

14. The transistor of claim 13, the plurality of separate portions of the gate region being within the plurality of separate implant regions.

15. The transistor of claim 9, the first conductivity type being a p conductivity type and the second conductivity type being an n conductivity type.

16. The transistor of claim 9, the gate region having a substantially annular shape that surrounds the drain.

17. The transistor of claim 9, the semiconductor layer comprising a p-epitaxial layer that is formed over a p+type substrate.

18. A Junction Field Effect Transistor (JFET) comprising:
a semiconductor layer of a first conductivity type;
a well region of a second conductivity type formed in a substrate, the well region including a channel region having an average dopant concentration substantially less than the average doping concentration of the remaining portions of the well region;
the channel region comprising a plurality of separate, alternating implant and diffusion regions of the second conductivity type, the plurality of separate implant regions being separated from one another by the plurality of separate diffusion regions, the implant regions having a higher average dopant concentration than the diffusion regions;
a source region and a drain region of the second conductivity type arranged in a spaced apart relationship in the well region;
a gate region of the first conductivity type interposed between the source region and the drain region and extending through the channel region of the well region.

19. The transistor of claim 18, the well region and the channel region being formed by ion implantation of a doping material.

20. The transistor of claim 18, the well region and the channel region being formed in the same ion implantation step.

21. The transistor of claim 18, the plurality of separate diffusion regions being formed by diffusion of the dopant between the plurality of separate implant regions.

22. The transistor of claim 18, wherein the gate region is segmented into a plurality of separate portions, the plurality of separate portions of the gate region being coincident with the plurality of separate implant regions.

23. The transistor of claim 22, the plurality of separate portions of the gate region being within the plurality of separate implant regions.

24. The transistor of claim 23, the first conductivity type being a p conductivity type and the second conductivity type being an n conductivity type.

25. The transistor of claim 24, the gate region having a substantially annular shape that surrounds the drain.

26. The transistor of claim 25, the semiconductor layer comprising a p-epitaxial layer that is formed over a p+type substrate.

* * * * *